United States Patent
Kimura

[11] Patent Number: 5,933,013
[45] Date of Patent: Aug. 3, 1999

[54] CALIBRATION CIRCUIT FOR CALIBRATING FREQUENCY CHARACTERISTICS OF AN AC/DC CONVERTER

[75] Inventor: Hiroki Kimura, Kumagaya, Japan

[73] Assignee: Advantest Corp., Tokyo, Japan

[21] Appl. No.: 08/752,320

[22] Filed: Nov. 19, 1996

[30] Foreign Application Priority Data

Nov. 22, 1995 [JP] Japan ................................... 7-328309

[51] Int. Cl.$^6$ .......................... G01R 35/00; G01R 19/22
[52] U.S. Cl. ........................................... 324/601; 324/119
[58] Field of Search ............................ 324/601, 76.19, 324/76.39, 119, 120

[56] References Cited

U.S. PATENT DOCUMENTS

| | | | |
|---|---|---|---|
| 3,600,675 | 8/1971 | Grenier | 324/600 |
| 4,061,891 | 12/1977 | Pommer | 324/142 X |
| 5,138,267 | 8/1992 | Komagata et al. | 324/601 |
| 5,172,064 | 12/1992 | Walls | 324/601 |
| 5,621,329 | 4/1997 | Tsao et al. | 324/601 |

*Primary Examiner*—Glenn W. Brown
*Attorney, Agent, or Firm*—Muramatsu & Associates

[57] ABSTRACT

A calibration circuit of an AC/DC converter which measures an AC voltage by converting the AC voltage to a DC voltage. The AC/DC converter measures the AC voltage with high accuracy with low cost by having a calibration circuit to correct the frequency response characteristic involved in an AC/DC conversion process. The AC/DC converter includes a signal generator for generating at least two calibration signals having the same energy level and different frequency spectrums, a switch for selecting the input signal to be measured or one of the calibration signals from the signal generator, an amplifier for amplifying the selected signal from the switch wherein the amplifier has a circuit arrangement for adjusting a frequency characteristic thereof, and an AC/DC conversion circuit for converting an AC voltage from the amplifier to a corresponding DC voltage.

12 Claims, 6 Drawing Sheets

(a)

(b)

(c)

(a)

(b)

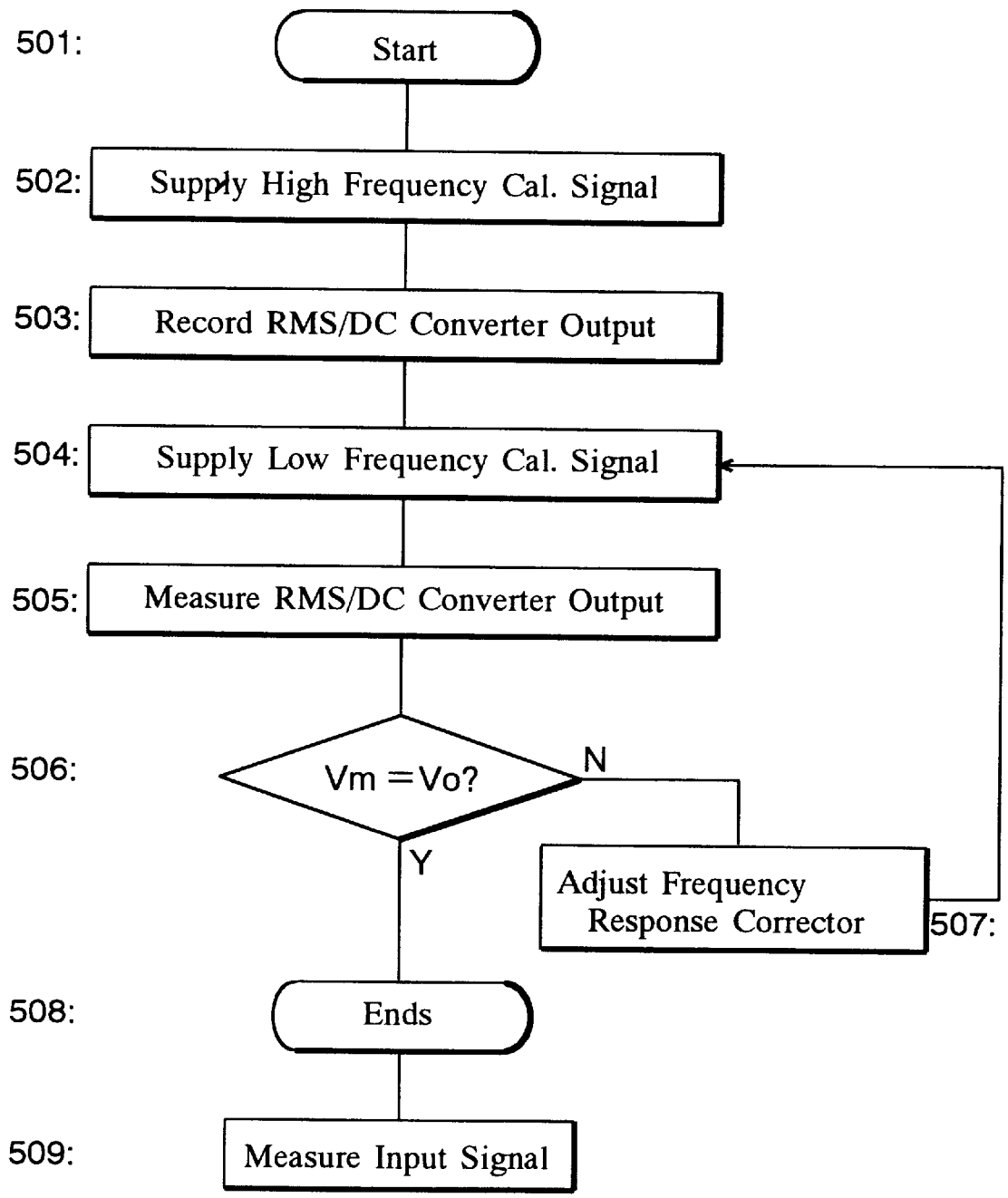

CALIBRATION CIRCUIT FOR CALIBRATING FREQUENCY CHARACTERISTICS OF AN AC/DC CONVERTER

FIELD OF THE INVENTION

This invention relates to a calibration circuit of an AC/DC converter for measuring an AC voltage by converting the AC voltage to a DC voltage, and more particularly, to an AC/DC converter and its conversion method for measuring the AC voltage with high accuracy with low cost by having a calibration function to correct the frequency characteristic involved in an AC/DC conversion process.

BACKGROUND OF THE INVENTION

In measuring an AC (alternating current) voltage of an input signal, the input AC voltage is converted to a corresponding DC (direct current) voltage, and then the DC voltage is measured by an AD (analog to digital) converter. An example of AC/DC converter in the conventional technology for measuring an AC voltage is shown in FIGS. 4 and 5. FIG. 4 is a block diagram showing a configuration of an AC/DC converter for measuring an AC voltage in the conventional technology. FIG. 5 shows a waveform diagram in a calibration process of the AC/DC converter of FIG. 4.

The AC/DC converter of FIG. 4 includes a signal generator 11 for generating a step voltage signal, a switch 31 for changing between an input signal and the step voltage signal from the signal generator 11, an amplifier 20 for amplifying an incoming signal, a switch 32, a sample hold 30 for sampling the incoming signal and holding the sampled voltage for a predetermined period of time, an RMS/DC converter 40 for converting an effective (root-mean-square) value of an AC voltage to a DC voltage, a switch 33 for changing between the outputs of the sample hold 30 and the RMS/DC converter 40, and an A/D converter 50. The amplifier 20 has a circuit arrangement such as shown in FIG. 3 to be able to adjust its frequency response curve.

To measure the AC voltage of the input signal, the switch 31 is set to a terminal (a) and the switches 32 and 33 are set to terminals (b), respectively. The AC voltage to be measured is amplified by the amplifier 20 and is converted to a DC voltage by the RMS/DC converter 40. The DC voltage is converted to digital data representing the AC voltage by the A/D converter 50.

Since an AC waveform of the input signal to be measured includes a wide range of frequency components, the AC/DC converter needs to have a flat frequency (frequency response curve ) characteristic in a wide range of frequency. To satisfy this requirement, in advance to the actual measurement of the input AC voltage, a calibration operation is performed in the AC/DC converter.

In the calibration operation, for correcting the frequency response of the amplifier 20, the switch 31 is set to the terminal (b) and the switches 32 and 33 are set to the terminals (a), respectively. The step signal from the signal generator 11 is supplied to the amplifier 20. As shown in FIG. 5, the step voltage signal 100 must have an accurate step waveform. The output of the amplifier 20 is provided to the sample hold 30. The sample hold 30 must have a high speed and high resolution capability to fully detect the transient response of the step signal at the output of the amplifier 20.

The sample hold 30 samples and holds the output of the amplifier 20. The voltage held by the sample hold 30 is read by the A/D converter 50 in digital data. The resulted data show different waveforms depending upon the frequency response characteristics of the amplifier 20. For example, the waveforms 101–103 in FIG. 5(a) may be produced at the output of the amplifier. The waveforms 101 and 103 show that the frequency characteristic of the amplifier 20 is inadequate since the waveform does not accurately reproduce the input step signal. In contrast, the waveform 102 shows that the frequency response of the amplifier is satisfactory for the intended frequency range.

Thus, by adjusting the frequency response curve of the amplifier 20, the frequency response of the amplifier 20 is adjusted to produce the accurate waveform such as the waveform 102 of FIG. 5(a). When the amplifier 20 is adjusted to output the step waveform 102 of FIG. 5(a), the frequency response curve is considered to be flat throughout the measuring frequency range.

Alternatively, the following procedure may be taken for adjusting the frequency response characteristic of the amplifier 20. While applying an input step signal 100 as shown in FIG. 5(a), the output of the amplifier 20 is measured two times through the sample hold 30 and the A/D converter 50 in the manner noted above. One measurement is made at the timing immediately after the step transition of the step voltage signal to determined the transient response of the amplifier 20. The other measurement is made at the timing sufficiently after the transient period, i.e., for the steady state of the input step signal.

The two measurement results are compared and the frequency response characteristic of the amplifier 20 is adjusted so that the two measurement results show the same value. When the amplifier 20 is adjusted to output the same measurement results between the first and second measurements for the step signal 100 of FIG. 5(a), the frequency response curve is considered to be flat throughout the measuring frequency range.

In the above noted calibration procedures, the step signal to be supplied to the amplifier must have an ideal step waveform. Therefore, to generate such an ideal step signal, the signal generator 11 is required to have a high performance capability to generate the calibration signal with high precision.

An example of a circuit arrangement for adjusting the frequency response curve in the amplifier 20 is shown in FIG. 3. The amplifier 20 has an attenuator 21 having an AC ladder configuration, an adjustable resistor Ra, a buffer amplifier 22, a variable gain amplifier 23, and a D/A converter 24. The details of the amplifier having the frequency characteristic correction ability is shown, for example, in Japanese Utility Model application No. 1993-4342.

To adjust the frequency response of the attenuator 21 of an AC ladder circuit, either capacitance or resistance of the ladder circuit may be regulated. In the amplifier 20 of FIG. 3, a combination of the adjustable resistor Ra and the variable gain amplifier 23 functions as a variable resistor and varies the overall frequency characteristic of the amplifier by changing the gain of the variable gain amplifier. The D/A converter 24 provides a control voltage to the variable gain amplifier 23. Thus, an automatic adjustment of the frequency response may be possible by providing digital data to the D/A converter based on the measurement results.

In the above noted calibration procedures, the step signal to be supplied to the amplifier must have an ideal step waveform. Namely, the waveform of the step signal must include sufficiently wide range of frequency components represented by its rising edge. The waveform of the step signal must not show an over shoot or an under shoot during the process of transition. The steady state voltage must be an accurate DC voltage.

Therefore, to generate such an ideal step signal, the signal generator 11 is required to have a high level capability such as a high speed and high precision. Further, to accurately sample the transient waveform of the step voltage signal, the sample hold 30 needs to operate with high speed and high resolution. It is difficult or practically inconvenient to realize such a high performance signal generator and a sample hold circuit.

SUMMARY OF THE INVENTION

Therefore, it is an object of the present invention to provide an AC/DC converter which is capable of accurately calibrating an internal circuit to improve conversion accuracy without using a high precision step signal generator or a high speed and high precision sample hold circuit.

It is another object of the present invention to provide an AC/DC converter which is capable of correcting a frequency response characteristic of the internal circuit by using a calibration signal with sufficient waveform quality which is relatively easy to generate with a less expensive circuit configuration.

It is a further object of the present invention to provide an AC/DC converter which is capable of correcting a frequency response characteristic of an internal amplifier by using two types of calibration signals having the same energy level and different frequency spectrums.

In the present invention, the AC/DC converter measures an AC voltage by converting the AC voltage with high accuracy with low cost by having a calibration function to correct the frequency characteristic involved in an AC/DC conversion process. Two calibration signals having the same energy level and different frequency spectrum distribution are used for calibrating the frequency characteristic.

The AC/DC converter of the present invention includes a signal generator for generating at least two calibration signals having the same energy level and different frequency spectrums, a switch for selecting either one of the input signal to be measured or the calibration signals from the signal generator, an amplifier for amplifying the selected signal from the switch wherein the amplifier is capable of adjusting its frequency response characteristics, and an AC/DC conversion means for converting an AC voltage from the amplifier to a corresponding DC voltage.

The AC/DC converter of the present invention further includes an A/D converter for converting the DC voltage from the AC/DC conversion means to digital data. The AC/DC converter converts a root-means-square value of the AC voltage to the DC voltage. Alternatively, the AC/DC converter converts an average value of the AC voltage to the DC voltage.

The further aspect of the present invention is a method of calibrating the AC/DC converter for measuring an AC voltage by utilizing two calibration signals having the same energy level and the different frequency spectrum distribution.

According to the present invention, the AC/DC converter is capable of calibrating AC/DC conversion circuit to improve the conversion accuracy without using a high precision step signal generator or a high speed and precision sample hold circuit. The AC/DC converter corrects a frequency response characteristic of the internal circuit by using a calibration signal with sufficient waveform quality which is relatively easy to generate with less expensive circuit configuration.

The AC/DC converter corrects the frequency response characteristic of the internal circuit by using two types of calibration signals having the same energy level and different frequency spectrums. Further, since the AC/DC converter does not need the sample hold circuit, the switches involved in the sample hold circuit are no longer necessary, which further contributes to improve an overall reliability.

BRIEF DESCRIPTION OF THE DRAWINGS

FIG. 7 is a flow chart showing an AC/DC conversion method of the present invention.

DETAILED DESCRIPTION OF THE PREFERRED EMBODIMENT

Figure 1:
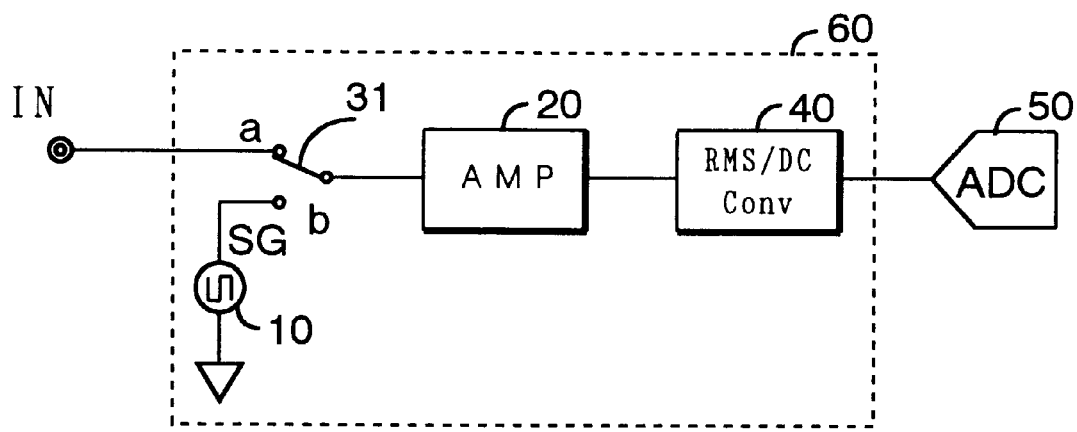
FIG. 1 is a block diagram showing a configuration of an AC/DC converter in the first embodiment of the present invention.
Figure 2:
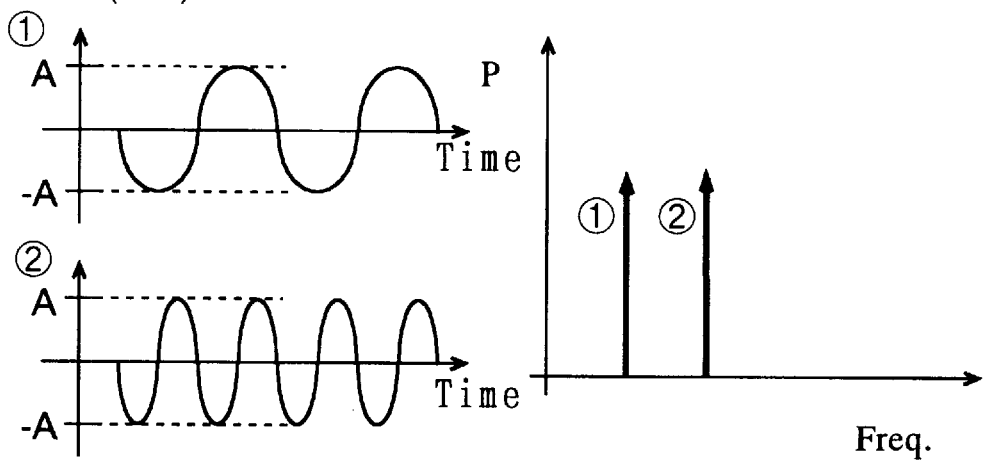
FIGS. 2(a)–2(c) show examples of calibration signals having the same energy level and different frequency spectrums to be used in the present invention.
Figure 2:
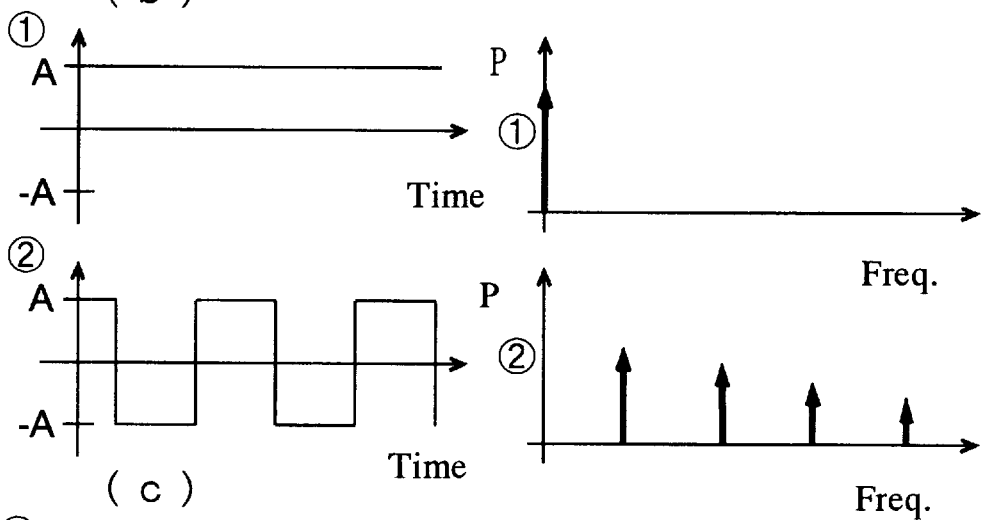
Figure 2:
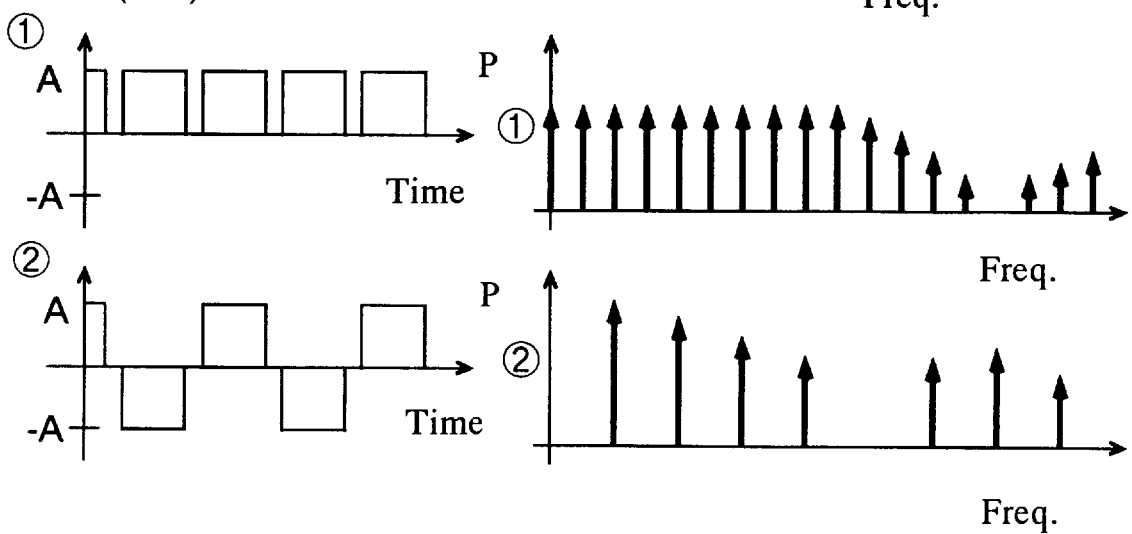

The first embodiment of the present invention is shown in FIGS. 1 and 2. The AC/DC converter of the present invention is formed of an AC/DC conversion circuit 60 and an A/C (analog to digital) converter 50. The AC/DC conversion circuit 60 includes a signal generator 10 for generating two kinds of calibration signals, a switch 31 for selecting either an input signal to be measured or the calibration signals from the signal generator 10, an amplifier 20 for amplifying an incoming signal, and an RMS/DC converter 40 for converting an effective (root-mean-square) value of an AC voltage to a DC voltage. The output of the AC/DC conversion circuit 60 is converted to digital data by the A/D converter 50. The amplifier 20 has a circuit arrangement such as shown in FIG. 3 to be able to adjust its frequency response curve.

When measuring an AC voltage of an input signal, the switch 31 is set to a terminal (a) so that the input signal is amplified by the amplifier 20 and the effective (root-mean-square) value of the AC voltage is converted to the corresponding DC voltage by the RMS/DC converter 40. The DC voltage at the output of the RMS/DC converter 40 is further converted to digital data by the A/D converter 50 to express the measured result with high resolution.

When performing a calibration process of the frequency characteristic of the AC/DC converter, the switch 31 is set to the terminal (b) to received the calibration signals from the signal generator 10. The signal generator 10 can generate at least two kinds of calibration signals having the same energy level and different frequency spectrums. One calibration signal has a frequency spectrum distribution relatively higher than a turning point of the frequency characteristic of the amplifier 20 and the other calibration signal has a frequency spectrum relatively lower than the turning point.

Figure 3:
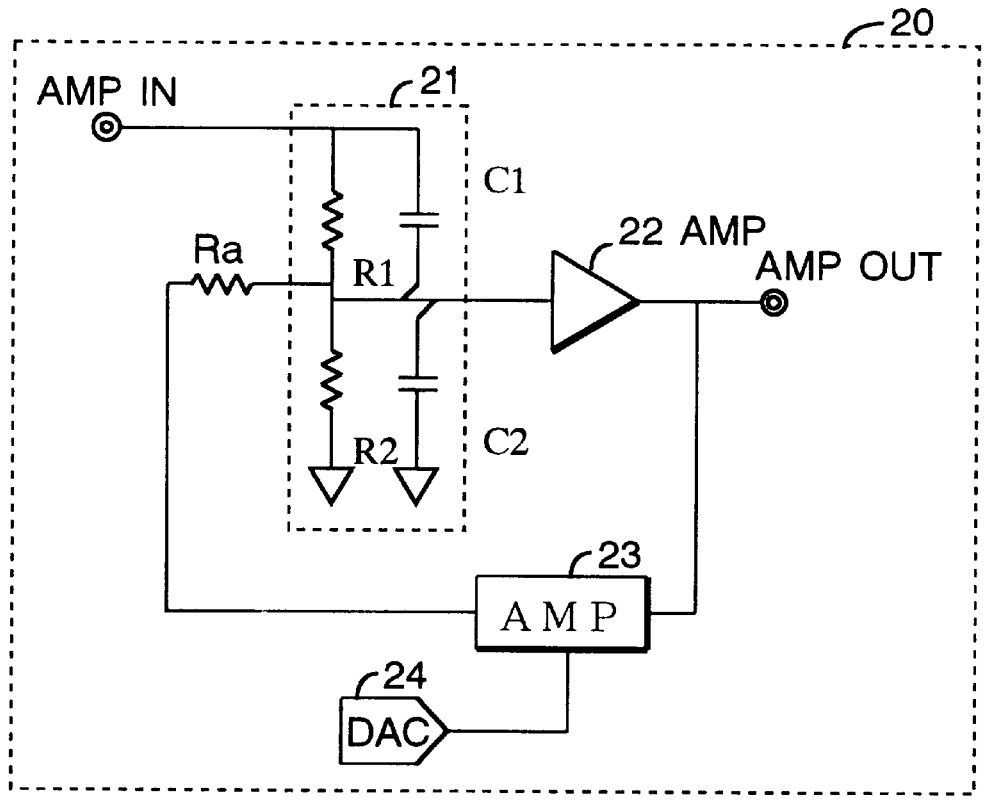
FIG. 3 is a block diagram showing an example of an amplifier having a frequency response characteristic correction function.
Figure 4:
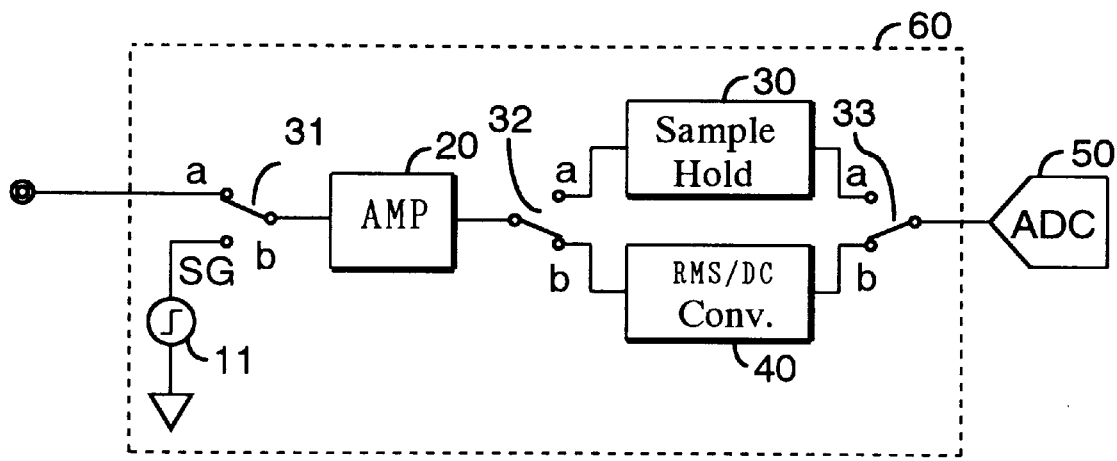
FIG. 4 is a block diagram showing an example of a conventional AC/DC converter.

Here, within the context of the present invention, the turning point noted above is a frequency at which an impedance determined by $R_1C_1$ and an impedance determined by $R_2C_2$ in the AC attenuator of the amplifier of FIG. 3 are identical. Typically, the higher frequency spectrums exist in a signal having a fundamental frequency higher than the turning point while the lower frequency spectrums exist in a signal having a fundamental frequency lower than the turning point.

In the calibration operation, one of the calibration signals, for example a one having the relatively higher frequency components from the signal generator 10 is supplied to the amplifier 20 in the AC/DC converter. The calibration signal is amplified by the amplifier 20 and converted to a DC voltage by the RMS/DC converter 40. The DC voltage is converted to digital data by the A/C converter 50 and is recorded. Then, in the similar manner, the calibration signal having the lower frequency components is supplied to the amplifier in the AC/DC converter and converted to the digital data.

Figure 5:
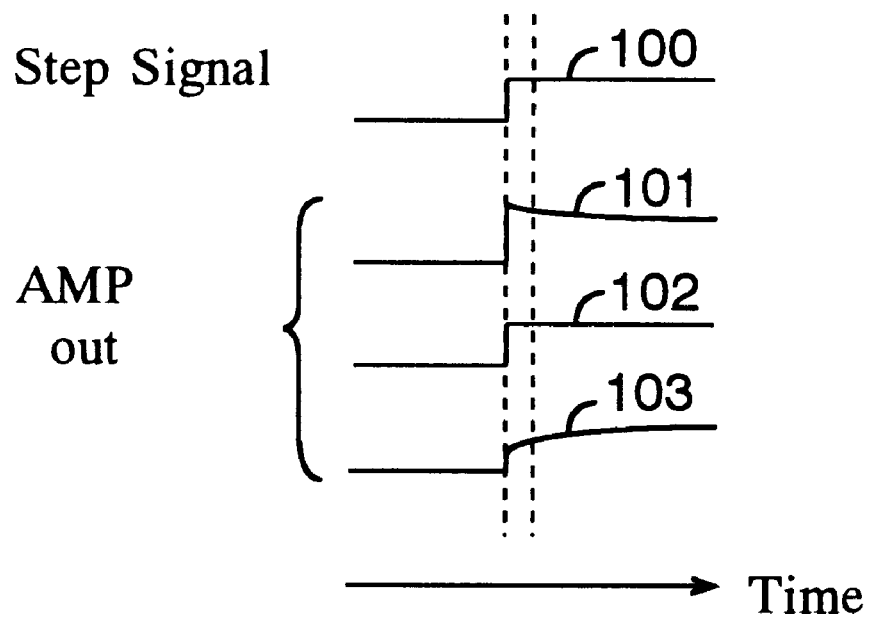
FIGS. 5(a) and 5(b) are waveform diagrams showing waveforms involved in calibrating the frequency response in the AC/DC converter.
Figure 5:
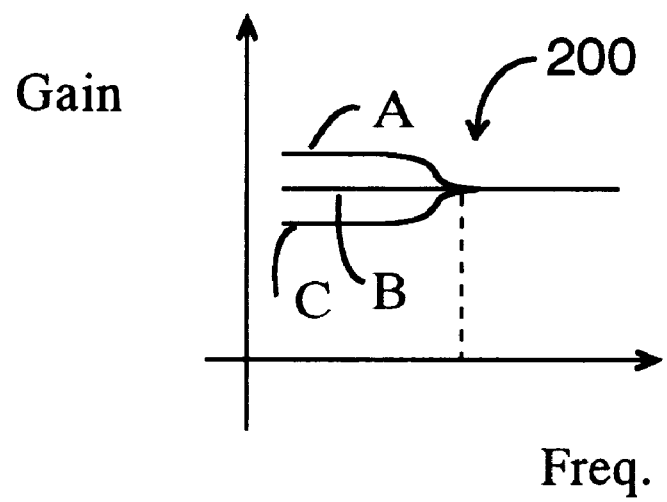

The digital data in the first and second measurements are compared and the frequency response characteristic of the amplifier 20 is adjusted such that the measured data for the two kinds of calibration data show the same value. Thus, as shown in FIG. 5(b), the frequency response in the first measurement and the second measurement are adjusted to be flat across the turning point 200 as an intermediate line B. If the result of the adjustment for the first calibration signal is affected by the adjustment for the second calibration signal, the above procedure is repeated until reaching the appropriate adjustment point in the frequency response of the amplifier 20. As a result of this calibration procedure, the frequency response characteristic of the AC/DC converter including the amplifier having the AC ladder circuit is calibrated in a wide frequency range.

FIGS. 2(a)–2(c) show examples of calibration signals having the same energy level and different frequency spectrums to be used in the present invention. The left side of the FIGS. 2(a)–2(c) shows the waveforms of the calibration signal with designated amplitude values in the time domain while the right side of the FIGS. 2(a)–2(c) shows frequency spectrums of the corresponding calibration signals in the frequency domain.

The example of FIG. 2(a) shows two kinds of calibration signals (1) and (2) each of which has a signal frequency spectrum. The example of FIG. 2(b) shows another two kinds of calibration signals (1) and (2). The calibration signal (1) is a DC voltage while the calibration signal (2) is a rectangular wave signal having the same energy level as the DC signal (1). The example of FIG. 2(c) shows two kinds of calibration signals (1) and (2) both of which are rectangular waves.

In all of the combination of the calibration signals in FIG. 2, the two kinds of calibration signals have the same energy level and the different frequency spectrum distribution. The energy of the calibration signal is a total power of all the spectrums which is equal to the root-mean-square value of the calibration signal.

The calibration signals of the present invention are relatively easy to generate without using an expensive circuit arrangement. For example, the calibration signals shown in FIG. 2(c) can be generated by periodically switching the reference voltage and a zero voltage. Further, in the example of FIG. 2(c), since the total number of rising edges and falling edges in the calibration signals (1) and (2) are the same, the errors involved in the transition edges (because the rise time and the fall time are not zero), are canceled during the calibration process.

Figure 6:
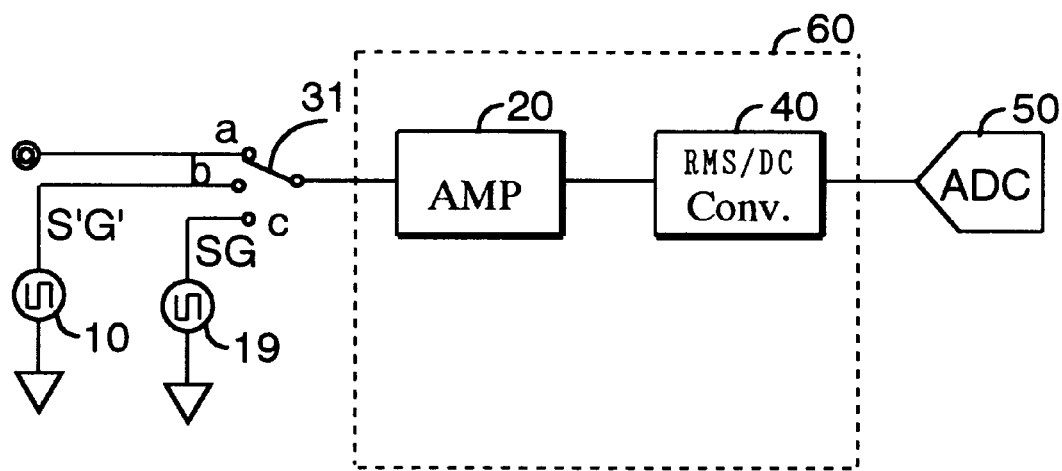
FIG. 6 is a block diagram showing a configuration of an AC/DC converter in the second embodiment of the present invention.

In the example of FIG. 1, the signal generator 10 generates two kinds of calibration signals. However, as shown in FIG. 6, two separate signal generators 10 and 19 may be provided to generate one calibration signal from each of the signal generators. The signal generators 10 and 19 may be installed inside of the AC/DC converter or provided outside of the AC/DC converter.

The RMS/DC converter 40 converts the AC voltage to the corresponding DC voltage by way of a calculation process, a thermal conversion process or other conversion process known in the art. When the AC/DC converter is desired to measure an average AC voltage of an input AC signal rather than the effective voltage value of the input AC signal, the RMS/DC converter is replaced with an AC average/DC converter. Further, in measuring the average AC voltage in the present invention, two kinds of calibration signals having the same average voltage value and different frequency spectrums are supplied to the AC/DC converter in the calibration procedure as noted above.

FIG. 7 is a flow chart showing the process of AC/DC conversion of the present invention. To measure an AC voltage of the input signal, the calibration process is performed. Mainly, the flow chart of FIG. 7 shows such a calibration process.

The calibration process starts in the step 501. The process proceeds to the step 502 wherein one of the calibration signals, for example, the one having the higher fundamental frequency is supplied to the AC/DC converter. The resulted DC voltage from the RMS/DC converter is measured by the A/D converter and the resulted digital data Vo is recorded in the step 503. Then the other calibration signal having the same energy level as the previous signal but the lower fundamental frequency is supplied to the AC/DC converter in the step 504. The resulted DC voltage from the RMS/DC converter is measured by the A/D converter, resulting in the digital data Vm in the step 505.

In the next step 506, it is determined whether the measured data Vm is the same as the data Vo. If it is not, the frequency response characteristic of the amplifier 20 is controlled in the step 507 so that the both digital data become the same. In case where the result of the adjustment for the first calibration signal is affected by the adjustment for the second calibration signal, the above procedure in the steps 502–505 is repeated utili reaching the appropriate adjustment point. In reaching the state where the data Vm=Vo, the calibration process ends in the step 508 and the actual AC/DC conversion process starts in the step 509 wherein an AC voltage of input signal is measured by the AC/DC converter.

According to the present invention, the AC/DC converter is capable of calibrating AC/DC conversion circuit to improve the conversion accuracy without using a high precision step signal generator or a high speed and precision sample hold circuit. The AC/DC converter corrects a frequency response characteristic of the internal circuit by using a calibration signal with sufficient waveform quality which is relatively easy to generate with less expensive circuit configuration.

The AC/DC converter corrects the frequency response characteristic of the internal circuit by using two types of calibration signals having the same energy level and different frequency spectrums. Further, since the AC/DC converter does not need the sample hold circuit, the switches involved in the sample hold circuit are no longer necessary, which contributes to improve an overall reliability.

What is claimed is:

1. An AC/DC converter for measuring an AC voltage of an input signal, comprising:
   a signal generator for generating at least two calibration signals having the same energy level and different frequency spectrums, said calibration signals having either a step waveform or a rectangular waveform;
   a switch for selecting said input signal to be measured or one of said calibration signals from said signal generator;
   an amplifier for amplifying the selected signal from said switch, said amplifier having a circuit arrangement for adjusting a frequency characteristic thereof; and
   an AC/DC conversion means for converting an AC voltage from said amplifier to a corresponding DC voltage.

2. An AC/DC converter as defined in claim 1, further includes an A/D converter for converting said DC voltage from said AC/DC conversion means to digital data.

3. An AC/DC converter as defined in claim 1, wherein said AC/DC conversion means converts a root-means-square value of said AC voltage to said DC voltage.

4. An AC/DC converter as defined in claim 1, wherein said AC/DC conversion means converts an average value of said AC voltage to said DC voltage.

5. An AC/DC converter for measuring an AC voltage of an input signal, comprising:
   an amplifier for amplifying an incoming signal, said amplifier having a circuit arrangement for adjusting a frequency characteristic thereof;
   a first signal generator for generating a first calibration signal having a fundamental frequency higher than a predetermined turning point of said amplifier, said first calibration signal having either a step waveform or a rectangular waveform;
   a second signal generator for generating a second calibration signal having the same energy level as that of said first calibration signal and a fundamental frequency lower than said turning point of said amplifier, said second calibration signal having either a step waveform or a rectangular waveform;
   a switch for selectively supplying said input signal to be measured or one of said first calibration signal from said first signal generator or said second calibration signal from said second signal generator to said amplifier; and
   an AC/DC conversion means for converting an AC voltage from said amplifier to a corresponding DC voltage.

6. An AC/DC converter as defined in claim 5, further includes an A/D converter for converting said DC voltage from said AC/DC conversion means to digital data.

7. An AC/DC converter as defined in claim 5, wherein said AC/DC conversion means converts a root-means-square value of said AC voltage to said DC voltage.

8. An AC/DC converter as defined in claim 5, wherein said AC/DC conversion means converts an average value of said AC voltage to said DC voltage.

9. An AC/DC converter as defined in claim 5, wherein said predetermined turning point in said amplifier is a frequency determined by an impedance of $R_1C_1$ and an impedance of $R_2C_2$ in an AC attenuator of said amplifier.

10. A method for calibrating an AC/DC converter for measuring an AC voltage of an input signal, comprising the steps of:
    supplying a first calibration signal to an amplifier having a circuit arrangement for adjusting a frequency characteristic thereof, said first calibration signal having either a step waveform or a rectangular waveform;
    converting an effective value of an output of said amplifier resultant to said first calibration signal to a first DC voltage;
    supplying a second calibration signal having the same energy level as that of said first calibration signal while having a fundamental frequency higher than that of said first calibration signal to said amplifier, said second calibration signal having either a step waveform or a rectangular waveform;
    converting an effective value of an output of said amplifier resultant to said second calibration signal to a second DC voltage; and
    adjusting a frequency characteristic of said amplifier such that said first DC voltage and said second DC voltage are identical.

11. A method for calibrating an AC/DC converter as defined in claim 10, wherein said first DC voltage and said second DC voltage are measured by an A/D converter so that the measured data are compared in a digital signal form.

12. A method for calibrating an AC/DC converter as defined in claim 10, wherein each of said steps of converting said effective value is replaced with a step of converting an average value of an output of said amplifier.

* * * * *